(12) United States Patent
Cox (10) Patent No.: US 7,427,786 B1
(45) Date of Patent: Sep. 23, 2008

(54) DIODE DEVICE UTILIZING BELLOWS

(75) Inventor: Isaiah Watas Cox, Baltimore, MD (US)

(73) Assignee: Borealis Technical Limited, Gibraltar ( * ) Notice: Subject to any disclaimer, the term of this patent is extended or adjusted under 35 U.S.C. 154(b) by 51 days.

(21) Appl. No.: 11/657,938

(22) Filed: Jan. 24, 2007

Related U.S. Application Data (60) Provisional application No. 60/761,849, filed on Jan. 24, 2006.

(51) Int. Cl.
*H01L 29/74* (2006.01)

(52) U.S. Cl. .................................. 257/121; 257/729

(58) Field of Classification Search ................ 257/121, 257/729
See application file for complete search history.

(56) References Cited

U.S. PATENT DOCUMENTS

| | | |
|---|---|---|
| 2,510,397 A | 6/1950 | Hansell |
| 2,915,652 A | 12/1959 | Hatsopoulos |
| 3,021,472 A | 2/1962 | Hernqvist |
| 3,118,107 A | 1/1964 | Gabor |
| 3,169,200 A | 2/1965 | Huffman |
| 3,173,032 A | 3/1965 | Maynard |
| 3,194,989 A | 7/1965 | Garbuny |
| 3,238,395 A | 3/1966 | Sense |
| 3,239,745 A | 3/1966 | Hernqvist |
| 3,267,307 A | 8/1966 | Fox |
| 3,267,308 A | 8/1966 | Hernqvist |
| 3,281,372 A | 10/1966 | Haas |
| 3,300,660 A | 1/1967 | Bensimon |
| 3,328,611 A | 6/1967 | Davis |
| 3,376,437 A | 4/1968 | Meyerand, Jr. |
| 3,393,330 A | 7/1968 | Vary |
| 3,470,393 A | 9/1969 | Moncorge |
| 3,515,908 A | 6/1970 | Caldwell |
| 3,519,854 A | 7/1970 | Davis |

(Continued)

FOREIGN PATENT DOCUMENTS

DE 3404137 A1 8/1985

(Continued)

OTHER PUBLICATIONS

Chou et al., "Imprint Lithography with 25 Nanometer Resolution", Science, Apr. 5, 1996, pp. 85-87, vol. 272.

(Continued)

*Primary Examiner*—Douglas M Menz (57) ABSTRACT

A diode device is disclosed, comprising a pair of electrodes separated by bellows. The corrugated walls of the bellows create a tortuous thermal pathway thereby reducing parasitic heat losses and increasing the device's efficiency. The bellows' also allow for a controlled environment to be sustained within the device. In a preferred embodiment the controlled environment is a vacuum. In one embodiment, a modified electrode for use in a diode device of the present invention is disclosed, in which indents are made on the surface of the electrode. In a further embodiment the bellows comprise shape memory alloys: previously deformed bellows are attached to the diode device and then grown to set the gap between the electrodes. In further embodiments the use of corrugation is applied to other parts of the diode device to elongate its thermal pathway and thereby increase its efficiency. For example, in one embodiment the outer rims of electrodes in a diode device are corrugated to increase the device's thermal pathway.

20 Claims, 5 Drawing Sheets

U.S. PATENT DOCUMENTS

| | | | |
|---|---|---|---|
| 3,578,992 A | 5/1971 | Shimada |
| 3,600,933 A | 8/1971 | Johnston |
| 3,740,592 A | 6/1973 | Engdahl et al. |
| 3,821,462 A | 6/1974 | Kaufman et al. |
| 3,843,896 A | 10/1974 | Rason et al. |
| 4,004,210 A | 1/1977 | Yater |
| 4,011,582 A | 3/1977 | Cline et al. |
| 4,039,352 A | 8/1977 | Marinescu |
| 4,063,965 A | 12/1977 | Cline et al. |
| 4,188,571 A | 2/1980 | Brunson |
| 4,224,461 A | 9/1980 | Snyder, Jr. et al. |
| 4,281,280 A | 7/1981 | Richards |
| 4,373,142 A | 2/1983 | Morris |
| 4,410,951 A | 10/1983 | Nakamura |
| 4,423,347 A | 12/1983 | Kleinschmidt |
| 4,667,126 A | 5/1987 | Fitzpatrick |
| 4,686,162 A | 8/1987 | Stangl et al. |
| 4,880,975 A | 11/1989 | Nishioka et al. |
| 4,928,030 A | 5/1990 | Culp |
| 4,937,489 A | 6/1990 | Hattori |
| 4,958,201 A | 9/1990 | Mimura |
| 5,023,671 A | 6/1991 | DiVincenzo et al. |
| 5,028,835 A | 7/1991 | Fitzpatrick |
| 5,049,775 A | 9/1991 | Smits |
| 5,068,535 A | 11/1991 | Rabalais |
| 5,083,056 A | 1/1992 | Kondou |
| 5,119,151 A | 6/1992 | Onda |
| 5,229,320 A | 7/1993 | Ugajin |
| 5,233,205 A | 8/1993 | Usagawa et al. |
| 5,247,223 A | 9/1993 | Mori et al. |
| 5,307,311 A | 4/1994 | Sliwa, Jr. |
| 5,309,056 A | 5/1994 | Culp |
| 5,327,038 A | 7/1994 | Culp |
| 5,332,952 A | 7/1994 | Ugajin et al. |
| 5,336,547 A | 8/1994 | Kawakita et al. |
| 5,351,412 A | 10/1994 | Furuhata |
| 5,356,484 A | 10/1994 | Yater |
| 5,371,388 A | 12/1994 | Oda |
| 5,399,930 A | 3/1995 | Culp |
| 5,410,166 A | 4/1995 | Kennel |
| 5,432,362 A | 7/1995 | Lippens et al. |
| 5,465,021 A | 11/1995 | Visscher |
| 5,487,790 A | 1/1996 | Yasuda |
| 5,503,963 A | 4/1996 | Bifano |
| 5,521,735 A | 5/1996 | Shimizu et al. |
| 5,579,232 A | 11/1996 | Tong et al. |
| 5,592,042 A | 1/1997 | Takuchi |
| 5,604,357 A | 2/1997 | Hori |
| 5,654,557 A | 8/1997 | Taneya et al. |
| 5,675,972 A | 10/1997 | Edelson |
| 5,699,668 A | 12/1997 | Cox |
| 5,701,043 A | 12/1997 | Razzaghi |
| 5,705,321 A | 1/1998 | Brueck et al. |
| 5,719,407 A | 2/1998 | Ugajin |
| 5,722,242 A | 3/1998 | Edelson |
| 5,772,905 A | 6/1998 | Chou |
| 5,810,980 A | 9/1998 | Edelson |
| 5,874,039 A | 2/1999 | Edelson |
| 5,917,156 A | 6/1999 | Nobori et al. |
| 5,973,259 A | 10/1999 | Edelson |
| 5,981,071 A | 11/1999 | Cox |
| 5,981,866 A | 11/1999 | Edelson |
| 5,994,638 A | 11/1999 | Edelson |
| 6,064,137 A | 5/2000 | Cox |
| 6,084,173 A | 7/2000 | DiMatteo |
| 6,089,311 A | 7/2000 | Edelson |
| 6,117,344 A | 9/2000 | Cox et al. |
| 6,214,651 B1 | 4/2001 | Cox |
| 6,225,205 B1 | 5/2001 | Kinoshita |
| 6,232,546 B1 | 5/2001 | DiMatteo et al. |
| 6,281,514 B1 | 8/2001 | Tavkhelidze |
| 6,309,580 B1 | 10/2001 | Chou |
| 6,417,060 B2 | 7/2002 | Tavkhelidze et al. |
| 6,489,704 B1 | 12/2002 | Kucherov et al. |
| 6,495,843 B1 | 12/2002 | Tavkhelidze et al. |
| 6,531,703 B1 | 3/2003 | Tavkhelidze et al. |
| 6,680,214 B1 | 1/2004 | Tavkhelidze et al. |
| 6,720,704 B1 | 4/2004 | Tavkhelidze et al. |
| 6,774,003 B2 | 8/2004 | Tavkhelidze et al. |
| 6,869,855 B1 | 3/2005 | Tavkhelidze et al. |
| 6,876,123 B2 | 4/2005 | Marinovsky et al. |
| 6,914,312 B2 | 7/2005 | Nishikawa et al. |
| 6,919,605 B2 | 7/2005 | Tigelaar |
| 6,919,608 B2 | 7/2005 | Gregg |
| 6,975,060 B2 | 12/2005 | Styblo et al. |
| 7,074,498 B2 | 7/2006 | Tavkhelidze et al. |
| 7,166,786 B2 | 1/2007 | Tavkhelidze et al. |
| 7,169,006 B2 | 1/2007 | Tavkhelidze et al. |
| 7,211,891 B2 | 5/2007 | Shimogishi et al. |
| 7,253,549 B2 | 8/2007 | Tavkhelidze et al. |
| 2001/0046749 A1 | 11/2001 | Tavkhelidze et al. |
| 2002/0170172 A1 | 11/2002 | Tavkhelidze et al. |
| 2003/0042819 A1 | 3/2003 | Martinovsky et al. |
| 2003/0068431 A1 | 4/2003 | Taliashvili et al. |
| 2003/0152815 A1 | 8/2003 | LaFollette et al. |
| 2003/0221608 A1 | 12/2003 | Mori |
| 2004/0029341 A1 | 2/2004 | Cox et al. |
| 2004/0174596 A1 | 9/2004 | Umeki |
| 2004/0195934 A1 | 10/2004 | Tanielian |
| 2005/0104512 A1 | 5/2005 | Tavkhelidze et al. |
| 2005/0110099 A1 | 5/2005 | Shimogishi et al. |
| 2007/0056623 A1 | 3/2007 | Tavkhelidze et al. |

FOREIGN PATENT DOCUMENTS

| | | |
|---|---|---|
| DE | 3818192 A1 | 12/1989 |
| DE | 4025618 A1 | 2/1992 |
| EP | 0437654 A1 | 7/1991 |
| JP | 03155376 A | 7/1991 |
| JP | 404080964 A | 3/1992 |
| JP | 05226704 A | 9/1993 |
| JP | 07322659 A | 12/1995 |
| SU | 861916 A | 9/1981 |
| WO | WO-97/02460 A1 | 1/1997 |
| WO | WO-99/10974 A1 | 3/1999 |
| WO | WO-99/13562 A1 | 3/1999 |
| WO | WO-99/64642 A | 12/1999 |
| WO | WO-00/59047 A | 10/2000 |
| WO | WO-02/47178 A | 6/2002 |
| WO | WO-03/021758 A2 | 3/2003 |
| WO | WO-03/083177 A3 | 10/2003 |
| WO | WO-03/090245 A1 | 10/2003 |

OTHER PUBLICATIONS

Sungtaek Ju et al., "Study of interface effects in thermoelectric microfefrigerators", Journal of Applied Physics, Oct. 1, 2000, pp. 4135-4139, vol. 88, No. 7.

Hishinuma et al., "Refrigeration by combined tunneling and thermionic emmission in vacuum: Use of nanometer scale design", Appl Phys Lett, Apr. 23, 2001, pp. 2572-2574, vol. 78, No. 17.

Leon N. Cooper, "Bound Electron Pairs in Degenerate Fermi Gas", Physical Review, Nov. 15, 1956, pp. 1189-1190, vol. 104, No. 4.

Bardeen et al., "Theory of Superconductivity", Physical Review, Dec. 1, 1957, pp.1175-1204, vol. 108, No. 5.

Tavkhelidze et. al, "Observation of quantum interference effect in solids", Journal of Vacuum Science & Technology B: Microelectronics and Nanometer Structures, May 12, 2006.

Tavkhelidze et. al, "Observation of New Quantum Interface Effect in Solids", Vacuum Nanoelectronics Conference, 2005. IVNC 2005. Technical Digest of the 18th International.

Fitzpatrick, G.O. et al. "Close-Spaced Thermionic Converters with Active Spacing Control and Heat-Pipe Isothermal Emitters." 1996, IEEE.vol. 2: 920-927 (1996).

Fitzpatrick, G.O. et al. "Demonstration of Close-Spaced Thermionic Converters." Abs. Papers. Am. Chem. Soc. 93355: 1.573-1.580 (1993).

Fukuda. R. et al. "Development of the Oxygenated Thermionic Energy Converters Utilizing the Sputtered Metal Oxides as a Collector." Am. Inst. Phys.: 1444-1451 (1999).

Hatsopoulos, G.N. et al. "Thermionic Energy Conversion, vol. 1 Process and Devices." MIT: 222 (1974).

Houston. J.M. "Theoretical Efficiency of the Thermionic Energy Converter." J.Appl. Phys. 30: 481-487 (1959).

Huffman, F.N. et al. "Preliminary Investigation of a Thermotunnel Converter." I.E.C.E.C. vol. 1: 573-579 (1988).

King. D.B. et al. "Results from the Microminiature Thermionic Converter Demonstration Testing Program." Am. Inst. of Phys. 1-56396-846: 1432-1436 (1999).

Mahan, G.D. "Thermionic Refrigeration." J. Appl. Phys 76: 4362-4366 (1994).

Shakouri. A. et al. "Enhanced Thermionic Emission Cooling in High Barrier Superlattice Hetero- structures." Mat. Res. Soc. 545: 449-458 (1999).

Svensson, R. et al. "TEC as Electric Generator in an Automobile Catalytic Converter." IEEE. vol. 2: 941-944 (1996).

Zeng. T et al. "Hot Electron Effects on Thermionic Emission Cooling in Heterostructures." Mat. Res. Soc. 545: 467-472 (1999).

Fitzpatrick, G.O. et al. : "Updated perspective on the potential for thermionic conversion to meet 21st century energy needs" IECEC '97, Proceedings of the 32nd Intersociety Energy Conversion Engineering Conference. Energy Systems, Renewable Energy Resources, Environmental Impact and Policy Impacts on Energy. Honolulu, Hi Jul. 27,-Aug. 1, 1997, Intersociety Energy Convers. vol. 3&4, Jul. 27, 1997. pp. 1045-1051.

Kalandarishvili, A.G. : "The basics of the technology of creating a small interelectrode spacing in thermionic energy converters with the use of two-phase systems" IECEC '97, Proceedings of the 32nd Intersociety Energy Conversion Engineering Conference. Energy Systems, Renewable Energy Resources, Environmental Impact and Policy Impacts on Energy. Honolulu, HI Jul. 27,-Aug. 1, 1997, Intersociety Energy Convers. vol. 3&4, Jul. 27, 1997. pp. 1052-1056.

DIODE DEVICE UTILIZING BELLOWS

CROSS-REFERENCE TO RELATED APPLICATIONS

This application claims the benefit of Provisional Patent App. No. 60/761,849, filed Jan. 24, 2006.

BACKGROUND OF THE INVENTION

The present invention relates to diode devices, in particular, to reducing parasitic heat losses by providing a tortuous thermal pathway connecting the electrodes thereby increasing the efficiency of a diode device.

DEFINITIONS

"Thermionic or thermotunneling converter" is hereby defined as a Cool Chip or a Power Chip; devices that use electrical power or energy to pump heat, thereby creating, maintaining, or degrading a thermal gradient. They may accomplish this using thermionics, thermotunneling, or other methods as described in this application. It is to be understood that the present invention relates to Power Chips and Cool Chips.

"Gap Diode" is defined as any diode which employs a gap between the anode and the cathode, or the collector and emitter, and which causes or allows electrons to be transported between the two electrodes, across or through the gap. This includes close spaced (thermotunneling/field emission), mid-spaced (field enhanced thermionic emission) or large-spaced (thermionic emission). It is to be understood that further references to thermionic or thermotunneling emission include all variations of electron emission known to those skilled in the art. Gap Diodes require at least some gap between the anode and cathode. This may be in the form of a solid or a liquid or it may be evacuated such that a vacuum exists within the device. The Gap Diode may be used for Cool Chips, Power Chips, and for other diode applications.

Figure 1:
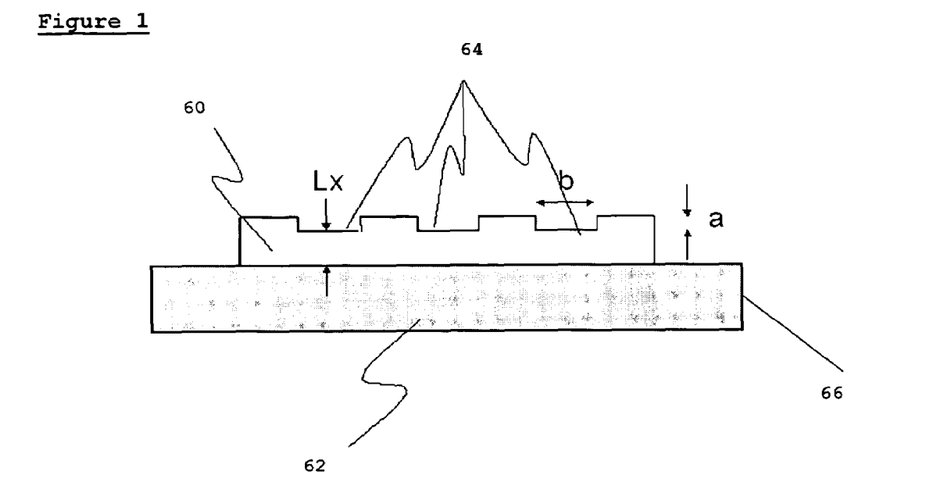
FIG. 1 is a cross sectional view of a prior art modified electrode.

In what follows, the term 'Avto Metals' is to be understood as a metal film having a modified shape, which increases the Fermi energy level inside the modified electrode, leading to a decrease in electron work function as described in the foregoing, and illustrated in FIG. 1 below.

"Matching" surface features of two facing surfaces of electrodes means that where one has an indentation, the other has a protrusion and vice versa. Thus, the two surfaces are substantially equidistant from each other across the entire electrode.

In U.S. Pat. No. 6,417,060 a method for manufacturing a pair of electrodes is disclosed which comprises fabricating a first electrode with a substantially flat surface and placing a sacrificial layer over a surface of the first electrode, wherein the sacrificial layer comprises a first material. A second material is placed over the sacrificial layer, wherein the second material comprises a material that is suitable for use as a second electrode. The sacrificial layer is removed with an etchant, wherein the etchant chemically reacts with the first material, and further wherein a region between the first electrode and the second electrode comprises a gap that is a distance of 50 nanometers or less, preferably 5 nanometers or less. This magnitude must be maintained to enable efficient electrode transfer. Alternatively, the sacrificial layer is removed by cooling the sandwich with liquid nitrogen, or alternatively still, the sacrificial layer is removed by heating the sacrificial layer, thereby evaporating the sacrificial layer.

In U.S. Pat. No. 6,774,003 a method for manufacturing a pair of electrodes is disclosed which comprises fabricating a first electrode with a substantially flat surface and placing a sacrificial layer over a surface of the first electrode, wherein the sacrificial layer comprises a first material. A second material is placed over the sacrificial layer, wherein the second material comprises a material that is suitable for use as a second electrode. The sacrificial layer is removed with an etchant, wherein the etchant chemically reacts with the first material, and further wherein a region between the first electrode and the second electrode comprises a gap that is a distance of 50 nanometers or less, preferably 5 nanometers or less. Alternatively, the sacrificial layer is removed by cooling the sandwich with liquid nitrogen, or alternatively still, the sacrificial layer is removed by heating the sacrificial layer, thereby evaporating the sacrificial layer.

The use of composite materials as matching electrode pair precursors is disclosed in U.S. Patent App. Pub. No. 2003/0068431. The approach comprises the steps of fabricating a first electrode with a substantially flat surface; placing over the first electrode a second material that comprises a material that is suitable for use as a second electrode, and separating the composite so formed along the boundary of the two layers into two matched electrodes.

In U.S. Patent App. Pub. No. 2003/0042819 a thermotunneling converter is disclosed comprising a pair of electrodes having inner surfaces substantially facing one another, and a spacer or plurality of spacers positioned between the two electrodes, having a height substantially equal to the distance between the electrodes, and having a total cross-sectional area that is less than the cross-sectional area of either of the electrodes. In a preferred embodiment, a vacuum is introduced, and in a particularly preferred embodiment, gold that has been exposed to cesium vapor is used as one or both of the electrodes. In a further embodiment, the spacer is made of small particles disposed between the electrodes. In a yet further embodiment, a sandwich is made containing the electrodes with an unoxidized spacer. The sandwich is separated and the spacer is oxidized, which makes it grow to a required height whilst giving it insulatory properties, to allow for tunneling between the electrodes.

In WO03/083177, the use of electrodes having a modified shape and a method of etching a patterned indent onto the surface of a modified electrode, which modifies the electronic energy levels inside the modified electrode, leading to a decrease in electron work function is disclosed. The method comprises creating an indented or protruded structure on the surface of a metal. The depth of the indents or height of protrusions is equal to a, and the thickness of the metal is Lx+a. The minimum value for a is chosen to be greater than the surface roughness of the metal. Preferably the value of a is chosen to be equal to or less than Lx/5. The width of the indentations or protrusions is chosen to be at least 2 times the value of a. Typically the depth of the indents is $\geq \lambda/2$, wherein $\lambda$ is the de Broglie wavelength, and the depth is greater than the surface roughness of the metal surface. Typically the width of the indents is $>>\lambda$, wherein $\lambda$ is the de Broglie wavelength. Typically the thickness of the indents is a multiple of the depth, preferably between 5 and 15 times said depth, and preferably in the range OF 20 to 500 nm. FIG. 1 shows the shape and dimensions of a modified electrode having a thin metal film 60 on a substrate 66. Indent 64 has a width b and a depth a relative to the height of metal film 60. Film 60 comprises a metal whose surface should be as planar as possible as surface roughness leads to the scattering of de Broglie waves. Metal film 60 is given sharply defined geometric patterns or indent 64 of a dimension that creates a de Broglie wave interference pattern that leads to a decrease in the electron work function, thus facilitating the emissions of electrons from the surface and promoting the transfer of elementary particles across a potential barrier. The surface configuration of the modified electrode may resemble a corrugated pattern of squared-off, "u"-shaped ridges and/or valleys. Alternatively, the pattern may be a regular pattern of rectangular "plateaus" or "holes," where the pattern resembles a checkerboard. The walls of indent 64 should be substantially perpendicular to one another, and their edges should be substantially sharp. The surface configuration comprises a substantially planar slab of a material having on one surface one or more indents of a depth approximately 5 to 20 times a roughness of said surface and a width approximately 5 to 15 times said depth. The walls of the indents are substantially perpendicular to one another, and the edges of the indents are substantially sharp.

In U.S. Pat. No. 6,720,704 diode devices are disclosed in which the separation of the electrodes is set and controlled using piezo-electric, electrostrictive or magnetostrictive actuators. This avoids problems associated with electrode spacing changing or distorting as a result of heat stress. In addition it allows the operation of these devices at electrode separations which permit quantum electron tunneling between them. Pairs of electrodes whose surfaces replicate each other are also disclosed. These may be used in constructing devices with very close electrode spacings.

In WO03/090245 a Gap Diode is disclosed in which a tubular actuating element serves as both a housing for a pair of electrodes and as a means for controlling the separation between the electrode pair. In a preferred embodiment, the tubular actuating element is a quartz piezo-electric tube. In another embodiment a Gap Diode is disclosed which is fabricated by micromachining techniques in which the separation of the electrodes is controlled by piezo-electric, electrostrictive or magnetostrictive actuators.

A significant drawback of the aforementioned disclosures is that the means for controlling and maintaining the separation between the electrodes of the diode device impairs the device's efficiency. In a diode device electrons travel through a gap between two electrodes. However, any material connecting the electrodes facilitates a thermal back-flow, which reduces the device's efficiency. The piezo elements separating the electrodes disclosed above are within the vacuum system thereby allowing a substantial thermal back-flow, increasing parasitic heat losses and decreasing the device's overall efficiency. In one embodiment of U.S. Pat. No. 6,720,704, corrugated tubes are disclosed, which can form part of the structure between the electrodes of a diode device. These tubes are intended to conduct heat and facilitate heat transfer between a heat source or sink and the electrodes. There is clearly a need in the art for a new device to separate an electrode pair, which provides a longer, tortuous thermal pathway thereby reducing parasitic heat losses whilst enabling a vacuum or other controlled environment to be maintained within a diode device.

BRIEF SUMMARY OF THE INVENTION

The present invention seeks to substantially minimize the thermal back-flow and parasitic heat flow losses occurring in a diode device by providing a tortuous thermal pathway between the electrodes. Additionally the present invention seeks to allow a controlled environment to be preserved within a diode device while maintaining the gap between the electrodes. The device of the present invention may be integrated or used for any ordinary diode application.

Accordingly, the present invention discloses flexible bellows that are attached to the electrode pair. Further embodiments of the present invention include the use of other corrugated surfaces within diode devices to elongate the thermal path. The flexible bellows may be utilized with any of the prior art devices to beneficial effect.

Accordingly, the thermal pathway connecting the electrode pair is long and tortuous the thermal back-flow is reduced and the overall efficiency of the device is increased.

Furthermore, the electrodes may be separated at a required distance and a vacuum or other controlled environment may be maintained within the device.

In additional embodiments of the present invention the use of corrugation is applied to other parts of a diode device to lengthen the heat path and thereby increase its overall efficiency. For example, in one embodiment the outer rim of the electrodes are corrugated to create a tortuous heat path between them.

Further objects and advantages of the present invention will become apparent from a consideration of the ensuing drawings and detailed description.

BRIEF DESCRIPTION OF THE SEVERAL VIEWS OF THE DRAWING

For a more complete understanding of the present invention and the technical advantages thereof, reference is made to the following description taken with the accompanying drawings, in which.

DETAILED DESCRIPTION OF THE INVENTION

The embodiments of the present invention and its technical advantages are best understood by referring to FIGS. 2-8. The present invention is directed to a diode device utilizing flexible bellows. It is to be understood that the diode device of the present invention may include a number of types of diode devices including, for example, (i) a device which uses a thermal gradient of any kind to generate electrical power using thermionics, thermotunneling or other methods as described herein; (ii) a device which uses electrical power or energy to pump heat, thereby creating, maintaining or degrading a thermal gradient using thermionics, thermotunneling or other methods as described herein; and (iii) as any diode which employs a gap between the anode and the cathode, or between the collector and emitter, and which causes or allows electrons to be transported between the two electrodes, across or through the gap (with or without a vacuum in the gap). Alternatively, the device of the present invention may be integrated or used for any ordinary diode application.

Figure 2:
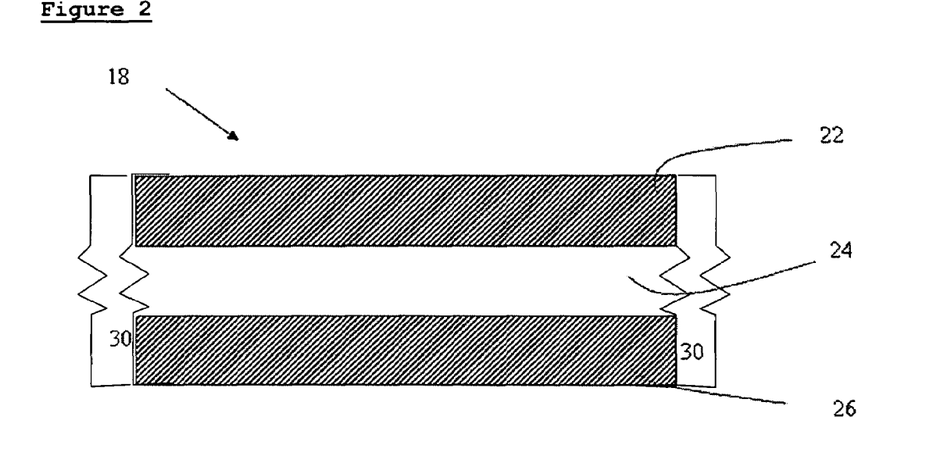
FIG. 2 is a cross-sectional view of a diode device of the current invention.

Referring now to FIG. 2, which shows a cross-sectional view of a diode device 18 of the current invention, a first surface 26 is separated from a second surface 22 by a gap 24. Flexible bellows 30 are attached to the edges of surfaces 26 and 22 and maintain gap 24. Bellows 30 are attached to surfaces 26 and 22 allowing a vacuum or other controlled environment to be formed and maintained between the two surfaces. It is to be understood that all further references to a vacuum include all relevant controlled environments. Although FIG. 2 shows bellows 30 with one ridge it is to be understood that more ridges may be used and that this is by way of an example only and does not limit the invention. Bellows 30 may be attached to the diode device 18 by approaches known to the art, including without limitation welding, brazing, soldering or adhesing. Although FIG. 2 shows bellows 30 attached to the edges of diode device 18 it is to be understood that other geometries are included within the scope of the invention.

Diode device 18 can function as a thermionic or thermotunneling converter, or as a thermionic or thermotunneling diode heat pump, such as those disclosed in the prior art, or as any other variation of gap diode known to those skilled in the art. In a preferred embodiment, electrodes 26 and 22 are matching. It is to be understood that the present invention is not limited to the variations disclosed.

Surfaces 26 and 22 comprise electrodes made of materials suitable for optimum performance. The corrugated walls of bellows 30 provide a long thermal backpath when device 18 is in operation, thus losses are reduced and the efficiency of device 18 is increased. When fully compressed bellows 30 comprise a rigid structure. Therefore bellows 30 may be constructed such that when fully compressed electrodes 26 and 22 are separated by a minimal gap 24 through which electrons can tunnel. Thus, if subjected to pressure electrodes 22 and 26 may remain apart and gap 24 will be preserved while still maintaining a long thermal pathway and the operation of device 18 is uninterrupted. Due to the flexibility of bellows 30, there is minimal disturbance within the controlled environment when electrodes 26 and 22 expand and contract during their operation as bellows 30 will respond accordingly.

Furthermore, because the walls of bellows 30 are extremely thin and sensitive only minute forces are required to produce large deflections enabling easy and precise spacing of electrodes 26 and 22. Therefore if spacing between electrodes 26 and 22 needs to be varied (because of thermal growth or vibration or any other reason), this allows precise positioning of the electrode pair to achieve maximum electron flow.

Bellows 30 may be beneficially utilized in the diode device configurations of the prior art.

For example, in one embodiment disclosed in U.S. Patent App. Pub. No. 2003/0042819 above, spacers are introduced between an electrode pair to set the distance between them. This diode device can be used in conjunction with the present invention in which bellows 30 may then be attached to the device to maintain the distance between the electrode pair and to hold the vacuum. In a further embodiment disclosed above (U.S. Patent App. Pub. No. 2003/0042819), a sandwich is made containing an electrode pair and an unoxidised spacer. The sandwich is separated and the spacer is oxidized, which makes it grow to a required height whilst giving it insulatory properties, to allow for tunneling between the electrodes. Bellows 30 are then attached as disclosed and the device is sealed. It is to be understood that the present invention includes but is not limited by the prior art configurations disclosed above.

In a further embodiment electrodes 26 and 22 utilized in the present invention may be formed from materials disclosed in diode device configurations of the prior art. For example, electrodes disclosed in Patent Number WO03/090245 may be utilized with relatively little modification. Thus, in one embodiment the diode device of the present invention can be built with the modified electrode disclosed in WO03/083177 and shown in FIG. 1, which allows for a decrease in the work function of the electrode, and therefore an increase in the efficiency of the device. It is to be understood that the modified electrode 66 may be used as one or both electrodes in the diode device of the present invention. Electrodes may be modified and then placed at a specified distance from each other and sealed by the use of the bellows of the present invention.

Figure 3:
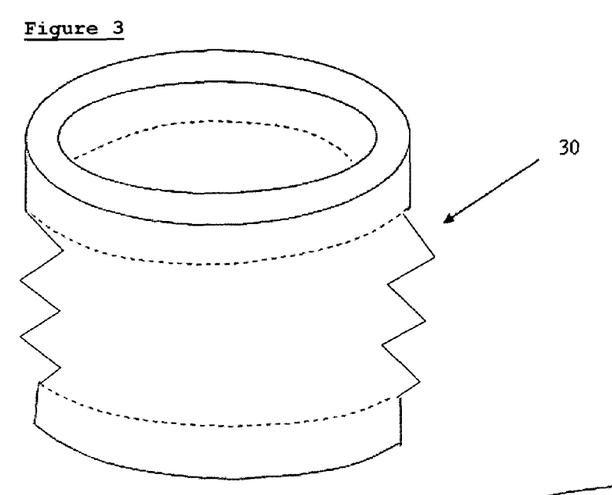
FIG. 3 is a greatly enlarged 3-dimensional view of the bellows used in the present invention.

Referring now to FIG. 3, which shows a greatly enlarged 3-dimensional view of bellows 30 for use in the present invention. The corrugated nature of bellows 30 significantly increases the thermal conductivity path, thus minimizing thermal back-flow and improving efficiency when used as part of a diode device. Bellows 30 may be made from materials including without limitation silicon, nickel and stainless steel. In a preferred embodiment of the present invention bellows 30 comprise materials with an extremely small coefficient of thermal expansion to further reduce the thermal back-flow. These materials such as some nickel and iron alloys and silicon compounds are known to those skilled in the art. Bellows 30 are also flexible and their walls are thin making them extremely responsive to any deflections.

Figure 4:
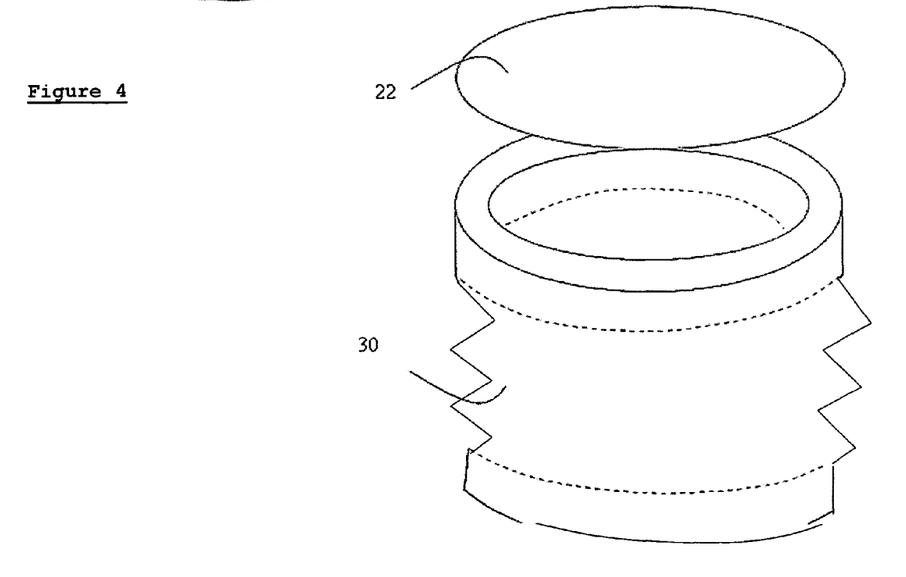
FIG. 4 is a greatly enlarged 3-dimensional view of one embodiment of the present invention in the course of fabrication showing bellows positioned directly between the electrodes.

Referring now to FIG. 4, which shows a greatly enlarged 3-dimensional view of one embodiment of the present invention in the course of fabrication. In this embodiment bellows 30 are positioned directly between electrodes 22 and 26. Electrodes 22 and 26 are as disclosed in FIG. 2 above. When the device is in operation, bellows 30 maintain the integrity of the vacuum between electrodes 22 and 26 and provide a long thermal pathway thereby reducing thermal losses and increasing the device's overall efficiency. Although FIG. 4 shows circular disc shaped electrodes 26 and 22, and cylindrical bellows 30 positioned directly between them, it is to be understood that this should not limit the present inventions. Further positions of bellows 30 utilizing different shaped electrodes 26 and 22 known to those skilled in the art may be used to maximize electron flow across the diode of the present invention.

Figure 5:
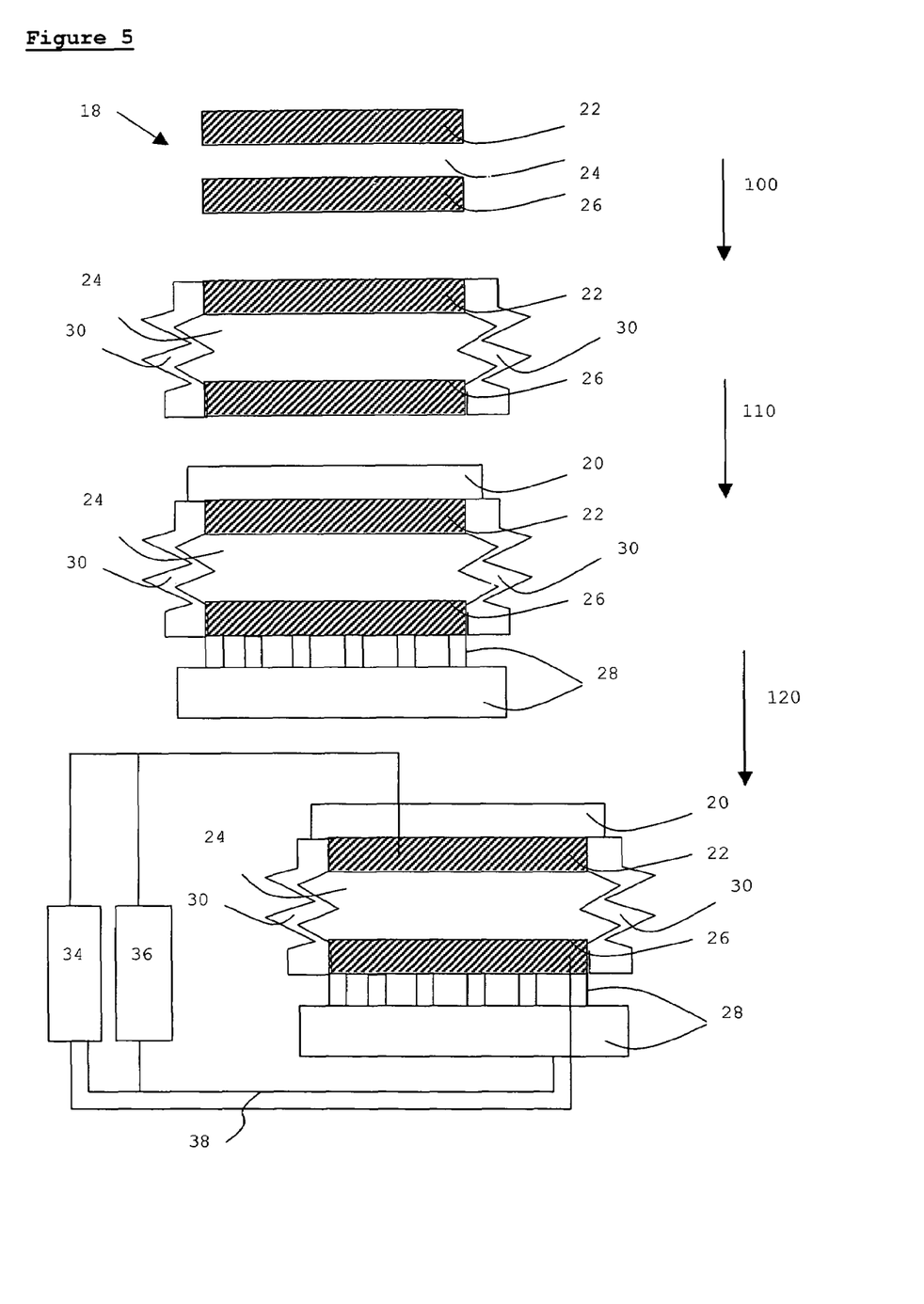
FIG. 5 is a schematic showing a process for the manufacture of one embodiment of the present invention.

Referring now to FIG. 5, which is schematic showing a process for the manufacture of one embodiment of the present invention. Diode device 18 is as shown in FIG. 2, and is constructed as disclosed in prior art comprising electrodes 26 and 22 positioned at the required distance thereby forming gap 24 through which electronic emission may occur. In step 100 bellows 30 are attached to electrodes 26 and 22, sealing diode device 18 so that a vacuum can be maintained. Bellows 30 are as disclosed above in FIGS. 2-4. In step 110, heat sink 20 is attached to one side of diode device 18 to remove heat produced. Being attached to heat sink 20 on one side also contributes to the stability of the device. On the other side a 6-axis piezo unit 28 is attached to respond to movement of electrodes 22 and 26 and thus control the distance of gap 24. Piezo unit 28 is then mounted on something rigid to hold the device in place. Piezo unit 28 is positioned a substantial distance away from electrodes 26 and 22. Because piezo unit 28 is not contained within the vacuum system and it has long struts rather than a ring, it presents minimal limitation or interference with the thermal pathway of device 18. Furthermore, piezo unit 28 has a lot of throw which compensates for the general flexibility of the device shown.

In step 120 electrodes 26 and 22 are connected to an electrical load or power supply 34 by means of wires 32 (34 is an electrical load when the device is a heat energy to electrical energy converter and is a power supply when the device is a heat pump). Electrodes 26 and 22 may also be connected to capacitance controller 36 which is able to assess the separation of the electrodes. The separation of electrodes 26 and 22 may be accurately controlled via a feedback loop 38 to piezo unit 28. Alternatively, in another embodiment actuators can be attached directly to bellows 30 so that they may respond to the deflections of bellows 30 and thus control electrode positioning. Due to the thin walls of bellows 30 they are extremely sensitive and responsive to movement of electrodes 26 and 22 during the operation, thus enabling precise positioning.

Typically gap 24 is of the order 1.0 to 1000 nm. However, to achieve maximum efficiency gap 24 is altered during the device's operation in response to movement of the electrodes. Bellows 30 are constructed such that when fully compressed bellows 30 comprise the minimal height of gap 24 through which electrons can tunnel successfully. Therefore if subjected to pressure or electrodes 22 and 26 will remain apart and gap 24 will be preserved while still maintaining a long thermal pathway.

Further embodiments of the present invention involve applying or modifying bellows 30 under different thermal conditions, using different material choices and different bellows geometries to accurately set and maintain the gap between the electrodes and thus achieve maximum efficiency.

Figure 6:
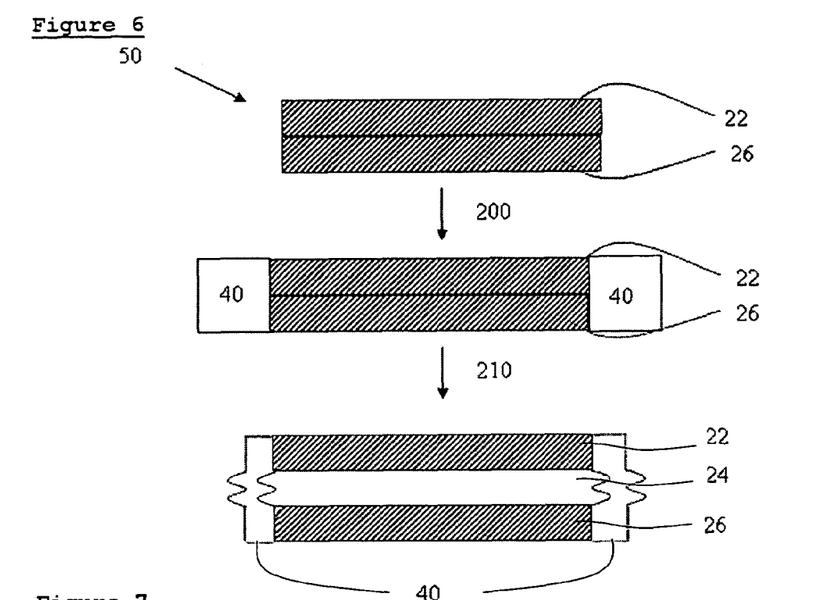
FIG. 6 is a schematic showing a process for the manufacture of a further embodiment of the present invention in which deformed bellows are attached to the diode device and then grown to set the gap between the electrodes.

For example, referring now to FIG. 6 which is a schematic showing a process for the manufacture of a further embodiment of the present invention in which deformed bellows are attached to the diode device and then grown to set the gap between the electrodes. An unfinished diode device 50 is built comprising electrodes 22 and 26. Electrodes 22 and 26 are as disclosed in FIG. 2 above. In step 200 deformed bellows 40 are attached to unfinished diode device 50 in the manner disclosed above. Deformed bellows 40 comprise Shape Memory Alloys (SMA) such as nickel-titanium alloys and copper-base alloys such as CuZnAl and CuAlNi. These are metallic materials that return to some previously defined shape or size when subjected to the appropriate thermal procedure. Deformed bellows 40 made from these materials may be plastically deformed to an appropriate size at a low temperature and then fitted to diode device 50 as disclosed. In step 210 the thermal environment is altered and the temperature is increased such that deformed bellows 40 grow to a predetermined size and gap 24 is formed between electrodes 22 and 26. Bellows 40 thereby set and maintain gap 24 between electrodes 22 and 26. Because the transformation occurs over a range of temperatures rather than at a single point, it is necessary to manipulate the thermal conditions and use part of bellows' 40 shape recovery to accurately position electrodes 22 and 26. Materials with a two-way shape memory known to those skilled in the art may be used such that they undergo change in shape upon heating and then return to their previous shape upon recooling. Alternatively materials that exhibit shape memory only upon heating and have one-way shape memory may be used.

In yet a further embodiment, electrodes 22 and 26 may be formed from a matching electrode pair precursor, which is a composite that may be separated along a boundary between two different composite layers into two matched electrodes, as disclosed in U.S. Patent Application Pub. No. 2003/0068431.

Figure 7:
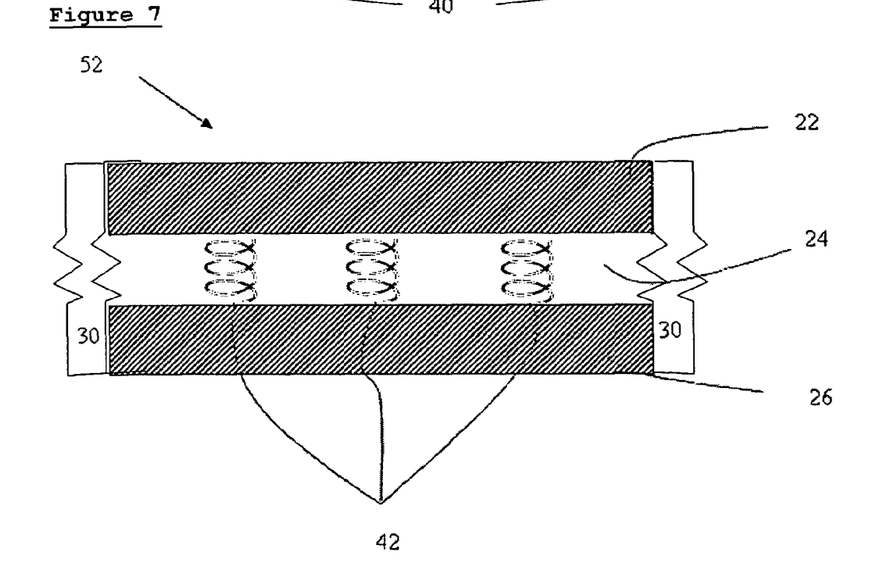
FIG. 7 is a cross-sectional view of one embodiment of a diode device of the present invention in which bellows are utilized as spacers.

Referring now to FIG. 7, which shows one embodiment of the present invention in which bellows are utilized as spacers. Diode device 52 is constructed as disclosed with electrodes 26 and 22 positioned substantially facing each other separated by a gap 24 through which electrons can tunnel. Electrodes 22 and 26 separated by gap 24 are as disclosed in FIG. 2 above. Bellows 30 are attached to diode device 52 as disclosed above. Smaller bellows 42 are positioned between electrodes 22 and 26 to act as spacers. Because the air seal is not needed within diode device 52, smaller bellows 42 comprise simple springs used to create a long pathway between electrodes 26 and 22. Since diode device 52 is subjected to movement from thermal expansion of electrodes 22 and 26 or other forces, rigid spacers separating the electrodes may break the device. Therefore smaller bellows 42 are used as spacers as they can respond to movement and gap 24 is restored during both tension and compression of the device. Furthermore the tortuous path created by the corrugated walls of smaller bellows' 42 reduce the thermal back-flow and minimize heat losses. In a further embodiment smaller bellows 42 are buried in electrode 26 forming a minute trench around them. This further reduces their conductivity thereby increasing the device's efficiency.

Accordingly the present invention is markedly more efficient than its prior art due to the corrugated walls of the bellows providing a longer thermal pathway and thereby minimizing parasitic heat losses during the diode device's operation.

Figure 8:
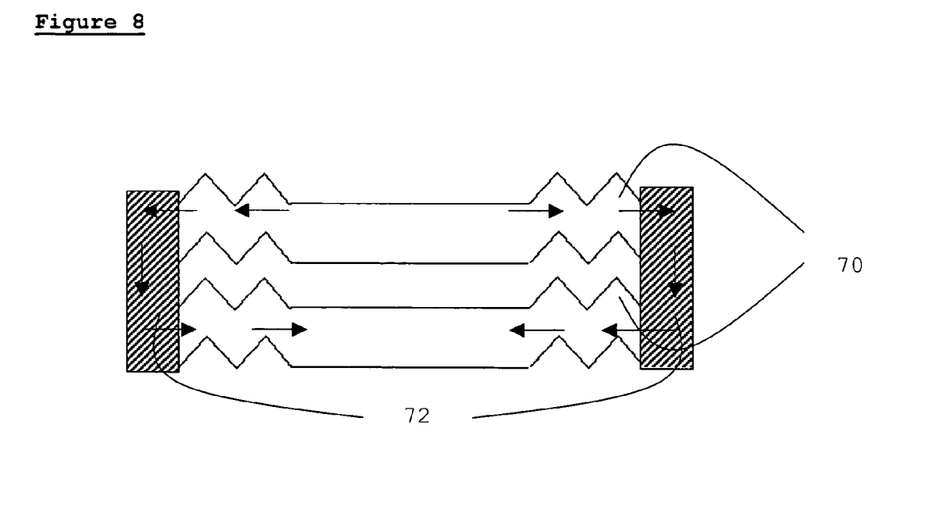
FIG. 8 is a cross-sectional view of a further embodiment of the present invention: a diode device utilizing electrodes comprising corrugated rims.

It is to be understood that the present invention includes the use of corrugation and other methods of increasing the heat path within a diode device known to those skilled in the art. For example, in a further embodiment the active area of the electrodes themselves are corrugated to substantially increase the heat path between the electrodes. FIG. 8 shows a cross sectional view of a further embodiment of the use of corrugation to increase the heat path between two electrodes. The outer rims of electrodes 70 are corrugated such that the span of their surface is longer than their width. This means that the heat path from the cold side to the hot side (or vice versa), as illustrated by the arrows, is substantially increased. Housing 72 may also comprise bellows as disclosed in embodiments above.

It is to be understood that this is not a complete list of all possible applications, but serves to illustrate rather than limit the scope of the invention. It is to be further understood that many other applications of this invention are possible, and that it is likely that the flexible bellows of the present invention may be utilized with different combinations of the diode device embodiments described above.

Accordingly, the invention is not limited to the embodiments described herein but should be considered in light of the claims that follow.

The invention claimed is:
1. A diode device comprising:
a first electrode;
a second electrode substantially facing said first electrode;
a housing disposed so as to separate said first electrode and said second electrode by a distance; and
an electrical circuit connected to said electrodes;
wherein said housing comprises bellows whereby said bellows provide a longer, tortuous thermal pathway; said pathway reducing parasitic heat losses and maintaining a controlled environment within said diode device.

2. The diode device of claim 1, wherein the walls of said bellows are corrugated.

3. The diode device of claim 2, wherein the length of said corrugated walls of said bellows are substantially longer than the height of said distance between said first electrode and said second electrode, whereby the thermal pathway between said electrodes is increased.

4. The apparatus of claim 1, wherein the walls of said bellows are substantially thin and flexible whereby minute forces applied to said walls produce large deflections of said walls.

5. The diode device of claim 1, wherein said bellows comprise a cylindrical shape with an upper end and a lower end and said first and said second electrodes are positioned at said upper and said lower end of said bellows, respectively.

6. The diode device of claim 1, wherein said bellows comprise a material or plurality of materials selected from the group consisting of: silicon, nickel and stainless steel.

7. The diode device of claim 1, wherein said bellows comprise a material or plurality of materials whereby said material or plurality of materials have low coefficient of thermal expansion.

8. The diode device of claim 1, wherein said bellows comprise shape memory alloy.

9. The diode device of claim 1, wherein said bellows are attached to said first and said second electrodes by means selected from the groups of: welding, brazing, soldering, adhesing, and mechanical attachment means such as screwing.

10. The diode device of claim 1, wherein said bellows attached to said first electrode and said second electrode sustain a controlled environment within said diode device.

11. The diode device of claim 1, wherein the height of said bellows when fully compressed is such that said distance between said electrodes comprises a magnitude sufficient to enable emission of electrons to occur between said electrodes.

12. The diode device of claim 1, wherein said first and said second electrodes comprise materials suitable for optimum thermionic or thermotunneling emission.

13. The diode device of claim 1 wherein said first electrode and said second electrode each comprise a surface for positioning facing the other, wherein said surfaces are substantially flat and wherein minor topographical features of said first electrode surface match topographical feature of said second electrode surface.

14. The apparatus of claim 1, wherein the magnitude of said distance separating said electrodes is between 1.0 and 1000 nm.

15. The diode device of claim 1 additionally comprising an actuating element whose length may be modified by a signal applied thereto, whereby the magnitude of said distance separating said electrodes may be set and controlled.

16. The diode device of claim 15, wherein said actuating element is attached to either or both of said electrodes.

17. The diode device of claim 15, wherein said actuating element is attached to said bellows.

18. The diode device of claim 15, wherein said actuating element comprises a 6-axis piezo unit element.

19. The diode device of claim 1, wherein said first electrode and said second electrode each comprise a surface for positioning facing the other and additionally comprising a spacer or plurality of spacers disposed between said electrodes to maintain said distance, and where the surface area of the spacer or plurality of spacers in contact with said surfaces is less than the surface area of said surfaces.

20. The diode device of claim 19, wherein said spacers comprise bellows or simple springs.

* * * * *